United States Patent [19]

Lewyn

[11] Patent Number: 5,640,162
[45] Date of Patent: Jun. 17, 1997

[54] DIGITAL-TO-ANALOG CONVERTER WITH BINARY CODED INPUTS TO PRODUCE A PLURALITY OF OUTPUTS IN THE FORM OF THERMOMETER CODE

[75] Inventor: Lanny L. Lewyn, Laguna Beach, Calif.

[73] Assignee: Brooktree Corporation, San Diego, Calif.

[21] Appl. No.: 317,489

[22] Filed: Oct. 4, 1994

[51] Int. Cl.⁶ .................................................. H03M 1/68
[52] U.S. Cl. ........................................... 341/144; 341/145
[58] Field of Search ................................. 341/144, 145, 341/153, 150, 154

[56] References Cited

U.S. PATENT DOCUMENTS

| | | | |
|---|---|---|---|
| 4,935,740 | 6/1990 | Schoowenhaars et al. | 341/135 |
| 5,017,919 | 5/1991 | Hull et al. | 341/136 |

*Primary Examiner*—Jeffrey A. Gaffin
*Assistant Examiner*—Peguy JeanPierre
*Attorney, Agent, or Firm*—Ellsworth R. Roston; Charles H. Schwartz

[57] ABSTRACT

Binary bits of least binary significance are converted to a corresponding analog output. Binary bits of increased binary significance are converted to a first plurality of thermometer outputs. A plurality of switching assemblies, each preferably recursive and preferably formed from a plurality of switches (e.g. transistors), process individual pairs of successive ones of such thermometer outputs. Each stage respectively produces first or second outputs or the analog output for first, second and third relationships between the thermometer outputs in such pair. The analog output has a variable value between the first and second outputs depending upon the value of the least significant binary bits. When the binary value is represented only by the binary bits of least and increased binary significance, the first, second and analog outputs are combined to produce an analog output representative of such binary bits. When the binary value additionally includes binary bits of even greater binary significance, an additional decoder decodes such binary bits to produce a second plurality of thermometer outputs. Second pluralities of switching assemblies, each plurality preferably having a construction corresponding to that of the first plurality, receive individual pairs of the thermometer outputs in the second plurality and produce the first or second outputs or an individual one of the outputs in the first plurality. These thermometer outputs are combined to produce an analog output representative of all of the binary bits. The second pluralities of switching assemblies comprise a number corresponding to the number of thermometer outputs in the second plurality.

46 Claims, 6 Drawing Sheets

DIGITAL-TO-ANALOG CONVERTER WITH BINARY CODED INPUTS TO PRODUCE A PLURALITY OF OUTPUTS IN THE FORM OF THERMOMETER CODE

This invention relates to a digital-to-analog converter. More particularly, the invention relates to a digital-to-analog converter which is simpler in construction and operates faster than corresponding converters of the prior art. The invention particularly relates to a converter which has recursive features. The digital-to-analog converter of this invention is especially adapted to be used in the telecommunications industry.

BACKGROUND OF THE INVENTION

Various types of equipment receive information in analog form. Such equipment includes process control equipment, measuring instruments, communication equipment and a wide variety of other equipment. Digital computers and data processing systems often receive input parameters in analog form from such equipment and convert these parameters to digital form for processing in the computer or the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

For example, digital information at a first telephone line interface can be converted to analog form at that interface. The processed information can be transmitted in analog form through telephone lines and received at a second interface distant from the first. The information received at the distant interface can then be converted to digital form. The digital information can comprise computer data or digitized video images.

A good example of the conversions discussed in the previous paragraph is in the recording and reproduction of music. The music is produced in analog form. It is converted to digital form by recently developed data processing techniques and is recorded on a medium such as a digital or a compact disc. When the music is to be reproduced, it is converted again to analog form because this is the form which operates sound transducers to give meaning to the listener when he hears the music.

As digital computers and data processing equipment have become widespread throughout industry and the office and have even become common in the home, the need for inexpensive, simple and reliable apparatus for converting information between digital and analog forms has become of increasing concern. A considerable effort has been devoted over a period of several decades to provide for converting apparatus which is simple, inexpensive and reliable. In spite of such efforts, the converting apparatus now in use does not meet such criteria.

The converting apparatus now in use also has other problems of long standing. For example, the converting apparatus now in use may not be monotonic unless it is quite expensive and complex. By "monotonic" is meant that digital information of progressively increasing value is converted to analog information of progressively increasing value without any decrease in the analog values as the digital value progressively increases. The converting apparatus now in use also has relatively high differential and integral nonlinearities unless the apparatus is quite expensive and complex. Integral non-linearities result from errors produced in a conversion between digital and analog values. Differential non-linearities result from errors produced in a conversion between digital and analog values over a relatively narrow range of such values.

The converting apparatus now in general use also has a problem of major proportions. This results when particular digital values are increased incrementally by a single digit. For example, problems in the converters now in use result when a binary representation of "511" is converted to a binary representation of "512". The results from the fact that the binary representation of "511" is represented by a value of 0111111111 and a binary representation of "512" is represented by 1000000000 where the least significant digit is at the right. As will be seen, the value of each binary digit changes when the decimal value changes from "511" to "512". As the binary values change from 0111111111 to 1000000000, discontinuities may occur because there is change between a binary value of "0" and a binary value of "1" at each binary position. These discontinuities may prevent the converter from being truly monotonic. This problem even exists in converters which are made quite complex in an attempt to overcome the problem.

There are other problems of long standing. For example, the number of binary bits of individual binary significance to be converted to analog values has been progressively increased in an attempt to enhance the resolution of the information being transmitted and received. As the number of binary bits has been increased, the complexities in the construction of the digital-to-analog converter has more than correspondingly increased. Furthermore, the rate of conversion has tended to decrease, partly as a result of such construction complexities.

It has been recognized that some of the problems discussed in the previous paragraph could be significantly resolved by providing the digital-to-analog converter with a recursive construction. In a converter with a recursive construction, a relatively simple construction block is provided on a generic basis and is repeated to convert successive bits of progressive binary significance.

In U.S. Pat. No. 4,857,929 issued to Henry S. Katzenstein on Aug. 15, 1989, for "Apparatus for Converting Data Between Analog and Digital Values" and assigned of record to the assignee of record of this application, apparatus is disclosed and claimed for converting between digital and analog values on a monotonic basis. Such apparatus is simple and inexpensive and reliable. It is able to operate with a high precision at high levels of power. As a result, the converting apparatus is capable of being used in areas not available for the converters of the prior art.

The apparatus disclosed and claimed in U.S. Pat. No. 4,857,929 also has other advantages of some importance. For example, it provides analog values of progressively increasing value as the digital value to be converted increases. It provides low differential and integral nonlinearities within a single array of switches. It is also free of the effects of aging and changes in temperature. It also provides accurate and reliable conversions between digital and analog values at high frequencies with minimal error. It is relatively simple in construction because it is recursive. In other words, successive stages of the converter are formed from progressive ones of a single relatively simple building block. This converter is also advantageous because it provides an interpolation line. The interpolation line may be connected to the array to receive a current from the output member to be connected next to the particular line for increasing binary values. The interpolation line and an additional array means receiving binary values of reduced digital significance may be connected to provide an output current from the additional array means in accordance with the value of the binary bits of reduced binary significance and for introducing such current to the converter output in representation of the analog value of the binary bits of reduced binary significance. By connecting such array of recursive switches to the interpolation line, the complexity of the converter can be considerably reduced. This tends to lower the total parasitic switch capacitance and enhance the frequency of operation of the converter.

The primary problem limiting resolution in the converter of U.S. Pat. No. 4,857,929 has been the absence of a method for uniformly distributing the interpolation current from the first array to the plurality of input nodes of a second array. Simple direct connection of a first array to a second similar array has produced results with differential linearity several bits less than the anticipated sum of the binary bits driving both arrays.

One object of the present invention is to provide a converter with differential linearity that does not appreciably degrade as additional arrays are assembled to form the converter.

In one embodiment of the invention disclosed and claimed in U.S. Pat. No. 4,857,929, apparatus is provided for converting between binary and analog values. The apparatus includes means for providing a plurality of signals representing the binary values. Pluralities of control switches are also provided, the number of control switches in each plurality being directly related to the binary significance of the control switches in such plurality. The control switches may be paired to provide for a conductivity of one switch in each pair. Each binary signal and its complement are introduced to a corresponding plurality of control switches. The number of switch pluralities required in the array is then equal to the number of control signal binary bits.

The switches in U.S. Pat. No. 4,857,929 are connected in a repetitive or recursive array to provide paths through the conductive ones of the control switches. The switches are connected in a circuit with output members and a particular line. Since the output members are conductive, the control switches operate to introduce the current through the output members to the particular line. This provides for progressive increases in the number of the output members connected to the particular line with progressive increases in the binary value and for a connection to the particular line of the output members previously connected to the particular line with progressive increases in the binary value. The cumulative current through the output members connected to the output line is indicative of the analog value. Because the number of switches connected between the output line and the particular line increases with the number of pluralities of switches provided, the frequency response of the array degrades in proportion to the number of control binary bits.

It is another objective of this invention to significantly improve frequency response by providing pluralities, or rows, of switches that are controlled by several binary bits, thereby greatly diminishing the number of switch pluralities required in a new converter with equivalent resolution.

Without the interpolation line in U.S. Pat. No. 4,857,929, the number of switches for each binary bit of progressively increased binary significance is double the number of switches for the binary bit of immediately lower binary significance. By providing the interpolation line, the output on the interpolation line from one binary bit can be introduced to an array of reduced complexity for the binary bit of next highest binary significance, thereby reducing the complexity of the switches for such next highest binary bit and the binary bits of even higher binary significance.

Even with the inclusion of the interpolation line and the reduced complexity of the switches for the next highest binary bit and the binary bits of even higher binary significance, the converter of U.S. Pat. No. 4,857,929 does not have as high a frequency range as would sometimes be desired. This has resulted from the fact that the number of switches in the converter is still relatively large and that each of these switches provides distributed capacitances which cumulatively limit the frequency of response of the converter. Another problem associated with the large number of switches is that a large quantity of charge is required to drive the switches from the reference potential source, making that source difficult to stabilize when operating at high frequencies.

Yet another object of this invention is to significantly reduce the number of switches required for an array of equivalent resolution and speed, thereby significantly reducing total array capacitance and reference drive current.

BRIEF DESCRIPTION OF THE INVENTION

This invention provides a converter which has all of the advantages described above for U.S. Pat. No. 4,857,929 including the provision of interpolation lines and a recursive construction. The converter of this invention uses the interpolation line to reduce the complexity of the stages which convert the binary bits of higher binary significance than the binary bits represented by the analog voltage value on the interpolation line. The converter of this invention also has other advantages of some importance. For example, the converter minimizes distributed capacitances, thereby substantially increasing the output frequency range of response. The converter is also able to provide a conversion between analog and digital values in a few nanoseconds with higher linear and differential linearities.

In addition, the converter of this invention decodes groups of successive binary bits and produces thermometer outputs representative of such decoding. These thermometer outputs may be processed on a recursive basis to provide the analog output representative of the binary inputs. By converting groups of progressive binary bits to thermometer outputs and by processing these outputs on a recursive basis, the number of distributed capacitances in the converter is significantly reduced and the range of frequency response of the converter is significantly enhanced.

In one embodiment of the invention, binary bits of least binary significance are converted to a corresponding analog output. Binary bits of increased binary significance are converted to a first plurality of thermometer outputs. A plurality of switching assemblies, each preferably recursive and preferably formed from a plurality of switches (e.g. transistors), process individual pairs of successive ones of such thermometer outputs. Each switching assembly respectively produces first or second outputs or the analog output for first, second and third relationships between the thermometer outputs in such pair. The analog output has a variable value between the first and second outputs depending upon the value of the least significant binary bits. When the binary value is represented only by the binary bits of least and increased binary significance, the first, second and analog outputs are combined to produce an analog output representative of the value of such binary bits.

When the binary value additionally includes binary bits of even greater binary significance, an additional decoder decodes such binary bits to produce a second plurality of thermometer outputs. Second pluralities of switching assemblies, each plurality preferably having a construction corresponding to that of the first plurality, receive individual pairs of the thermometer outputs in the second plurality and produce the first or second outputs or an individual one of the outputs in the first plurality. These thermometer outputs are combined to produce an analog output representative of all of the binary bits. The second pluralities of switching assemblies comprise a number corresponding to the number of the thermometer outputs in the second plurality.

DETAILED DESCRIPTION OF THE INVENTION

Figure 1:
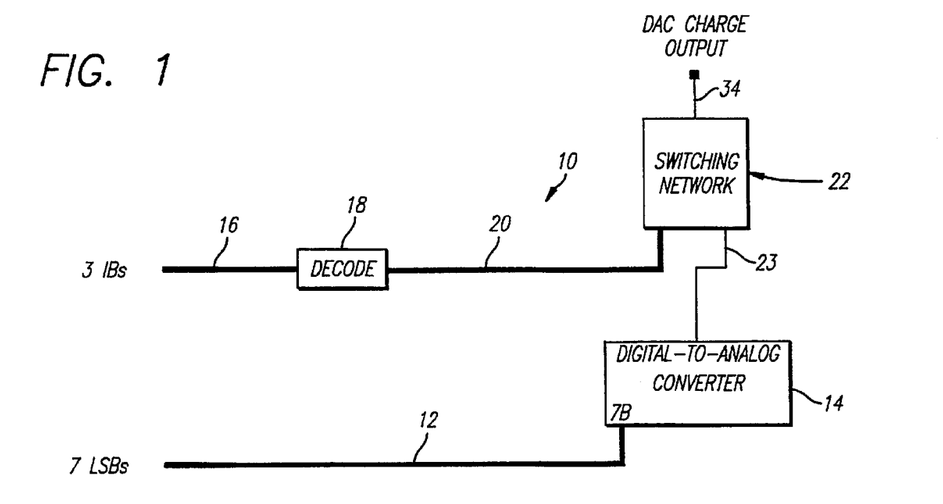
FIG. 1 is a schematic circuit diagram, partly in block form, of a digital-to-analog converter constituting one embodiment of the invention.

FIG. 1 is a circuit diagram, partially in block form, of a digital-to-analog converter generally indicated at 10 and constituting one embodiment of the invention. The converter includes a first bus 12 for receiving a plurality of binary bits, such as seven (7), of least binary significance and for introducing these bits to a converter 14. The converter 14 converts the binary bits to an analog output (e.g. a voltage) representative of the binary bits. The converter 14 may be constructed in a conventional manner.

The converter 10 also includes a bus 16 for receiving a plurality of binary bits such as three (3). These binary bits have a higher binary significance than the binary bits on the bus 12. The binary bits on the bus 16 are introduced to a decoder 18 which produces a plurality of thermometer outputs dependent upon the number of binary bits on the bus 16. For example, when three (3) binary bits are on the bus 16, the decoder produces seven (8) outputs in a thermometer code on a bus 20.

Figure 8:
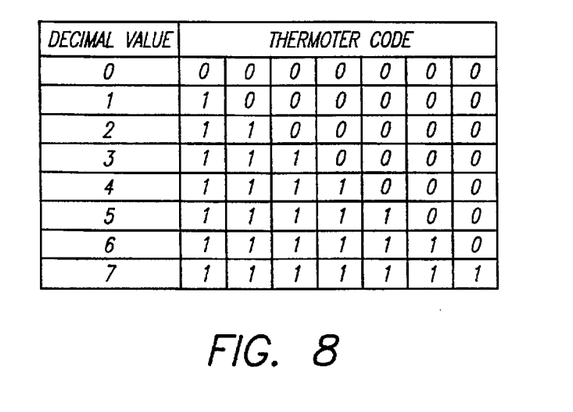
FIG. 8 is a chart indicating how decoders included in the embodiments shown in FIGS. 1–4 and 6–7 produce outputs on a thermometer code in accordance with the different values of the binary inputs introduced to such decoders.

The thermometer code produced by the decoder 18 is shown in FIG. 8. As will be seen, successive logic outputs of "1" are produced in a thermometer code in the decoder 18 as the decimal value represented by the three (3) binary bits on the bus 16 increases progressively from "0" to "7". The thermometer outputs produced by the decoder 18 pass through a bus 20 to a switching network generally indicated at 22 in FIG. 1. The analog output from the converter 14 also passes through a line 23 to the switching network 22. As will be seen from the subsequent discussion, the line 23 may be considered as an interpolation line.

Figure 2:
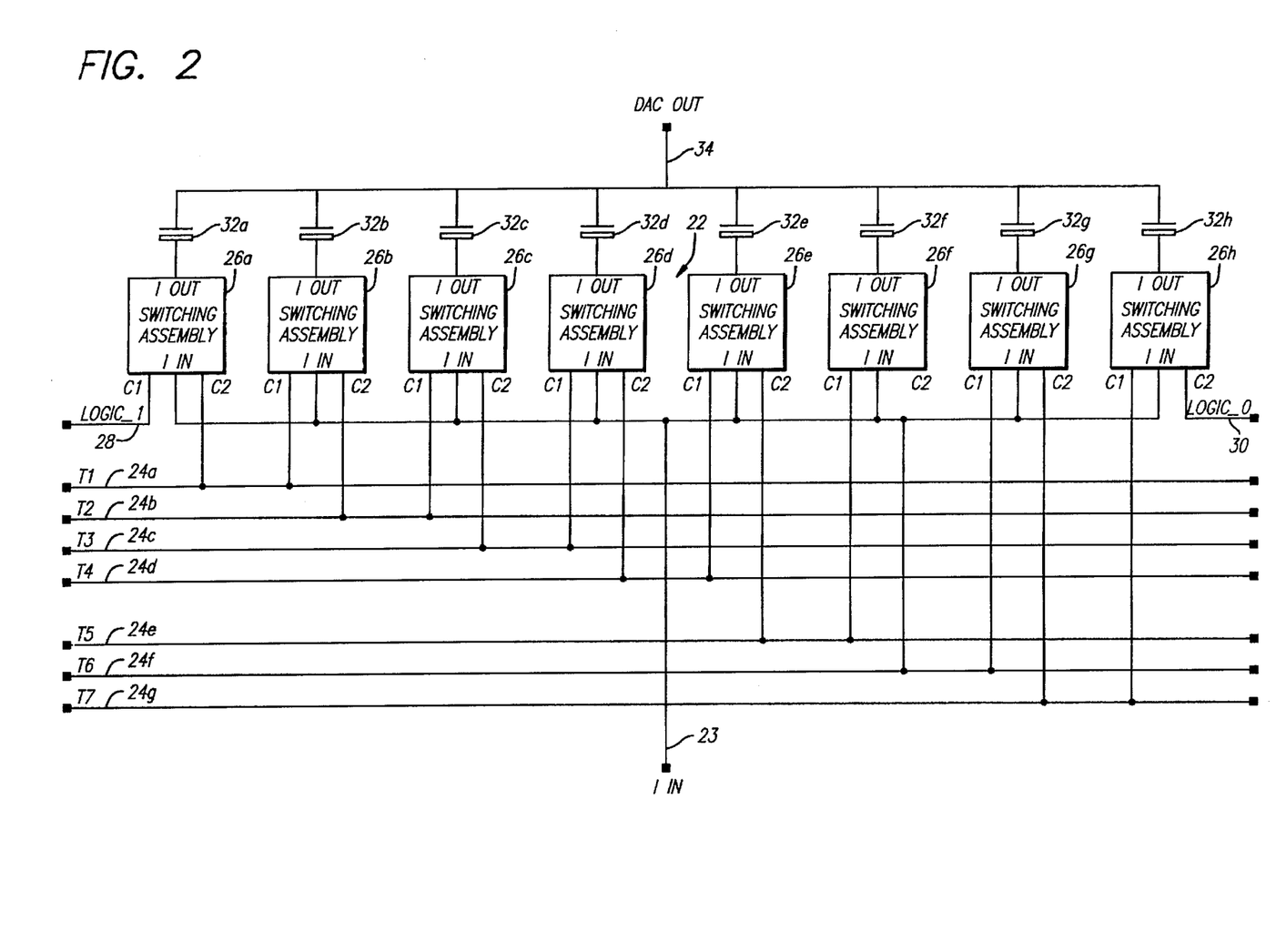
FIG. 2 is a circuit diagram showing in additional detail the switching assemblies constituting a switching network shown on a block basis in FIG. 1.

The switching network 22 in FIG. 1 is shown in additional detail in FIG. 2 as a plurality of switching assemblies 26a–26h. As shown in FIG. 2, the bus 20 includes a plurality of lines 24a, 24b, 24c, 24d, 24e, 24f and 24g. The lines 24a–24 g are respectively indicated in FIG. 2 as T1–T7. Each of the lines 24a–24 g indicates by a binary "1" or a binary "0" the value of an individual one of the thermometer outputs from the decoder 18. The line 23 included in FIG. 1 is also shown in FIG. 2. The plurality of switching assemblies 26a, 26b, 26c, 26d, 26e, 26f, 26g and 26h are also shown in FIG. 2. Each of the switching assemblies 26a . . . 26h has three (3) inputs. One of these inputs to each of the switching assemblies 26a . . . 26h is from the line 23. Second and third inputs to each of the switching assemblies 26a . . . 26h are on a progressive basis from pairs of the lines 24a . . . 24g providing the thermometer outputs from the decoder 18.

For example, the second and third inputs to the switching assembly 26a is from a line 28 providing a logic "1" and the line 24a, to the switching assembly 26b from the lines 24a and 24b, to the switching assembly 26c from the lines 24b and 24c and to the switching assembly 26d from the lines 24c and 24d. Similarly, the switching assembly 26e has input terminals connected to the lines 24d and 24e; the switching assembly 26f has input lines connected to the lines 24e and 24f; the switching assembly 26g has input terminals connected to the lines 24f and 24g; and the switching assembly 26h has input terminals connected to the line 24g and a line 30 providing a logic "0". The outputs from the switching assemblies 26a, 26b, 26c, 26d, 26e, 26f, 26g and 26h are respectively introduced to storage elements such as capacitors 32a, 32b, 32c, 32d, 32e, 32f, 32g and 32h. An output line 34 provides a summation of the charges in all of the capacitors 32a . . . 32h.

Each of the switching assemblies 26a . . . 26h compares the inputs to its second and third terminals and produces a signal in accordance with the results of such comparison. For example, the switching assembly 26d compares the inputs to its terminals from the lines 24c and 24d. When both lines 24c and 24d have a high voltage, the output from the switching assembly 26d is high. The output from the switching assembly 26d is low when the second and third inputs to the switching assembly from the lines 26c and 26d are low. The input on the line 23 passes to the output of the switching assembly 26d when the input on the line 24c is high and the output on the line 24d is low. The capacitor 32d is charged in accordance with the output from the switching assembly 26d.

Since the outputs on the lines 24a . . . 24g are in a thermometer code, the outputs from successive ones of these lines are high and the outputs from the remaining ones of these lines are low depending upon the thermometer value.

Successive ones of the switching assemblies 26a ... 26h produce outputs with a high value in accordance with the pattern of the outputs on the lines 24a ... 24g. However, one of the switching assemblies 26a ... 26h produces an output corresponding to the output on the line 23. As previously described, this output represents the value of the least significant binary bits on the bus 12 in FIG. 1. This output is provided at the particular one of the switching assemblies 26a ... 26h where the transition occurs between the high outputs from the successive ones of the switching assemblies and the low output from the successive ones of the switching assemblies. The line 34 accordingly passes from the capacitors 32a ... 32h a current having a magnitude representing in analog form the combined value of the binary bits on the buses 12 and 16 in FIG. 1.

Figure 3:
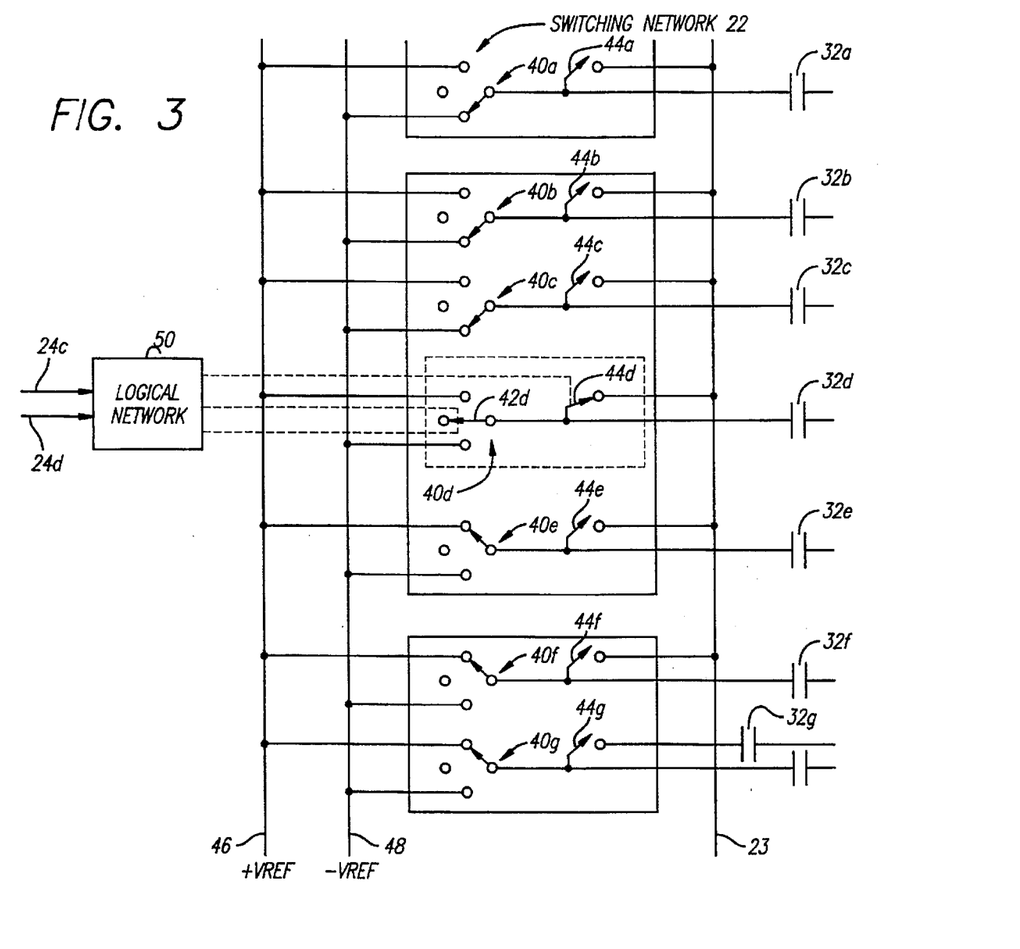
FIG. 3 is a circuit diagram schematically showing in additional detail a mechanical version of several of the switching assemblies shown in block form in FIG. 2.

FIG. 3 shows in additional detail a mechanical version of the switching assemblies 26a ... 26h in FIG. 2. These switching assemblies are generally indicated at 40a, 40c, 40d, 40e, 40f, 40g and 40h. They respectively correspond to the switching assemblies 26a ... 26h in FIG. 2. As will be seen, each of the switching assemblies 40a ... 40h in FIG. 3 is recursive in that it has a construction identical to that of the other switching assemblies.

The switching assembly 40d is shown within broken lines 41 in FIG. 3. It includes a single-pole double-throw switch 42d and a single-pole single-throw switch 44d. The switch 42d has a movable arm connected to the capacitor 32d also shown in FIG. 2. An upper stationary contact of the switch 42d is a connected to receive a positive reference voltage +$V_{REF}$. Similarly, a lower stationary contact of the switch 42d receives a negative reference voltage −$V_{REF}$. The movable arm of the switch 42d is common with the movable arm of the switch 44d. The stationary contact of the switch 44d has a common connection with the line 23 also shown in FIGS. 1 and 2.

The movable arm of the switch 42d engages the upper stationary contact of the switch (with the switch 44d open) when both of the inputs to the switch from the lines 24c and 24d have a high value. This causes the +$V_{REF}$ voltage on a line 46 to be introduced through the switch 42d to charge the capacitor 32d. When both of the inputs to the switch 42d have low values, the movable arm of the switch engages the lower stationary contact of the switch (with the switch 44d open) so that the capacitor 32d becomes charged by the −$V_{REF}$ voltage on a line 48. When the switch 42d receives a high input on the line 24c and a low input on the line 24d, the movable arm of the switch 42d remains in a neutral position and the movable arm of the switch 44d engages the stationary contact of the switch. The voltage on the line 23 is accordingly introduced to the capacitor 32d to charge the capacitor.

A logical network 50 is shown in FIG. 3 as receiving the inputs which control the positionings of the movable arms of the switches 42d and 44d. For the logical network 50, these inputs are the voltages on the lines 24c and 24d in FIG. 4. The outputs of the logical network 50 are shown by broken lines in FIG. 3 as being introduced to the movable arms of the switches 42d and 44d to control the positionings of these movable arms. It is believed that the construction of the logical network 50 will be obvious to a person of ordinary skill in the art. It will be appreciated that a separate logical network corresponding to the logical network 50 will be provided for each of the other switching assemblies 40a–40c and 40e–40h in FIG. 3.

Figure 4:
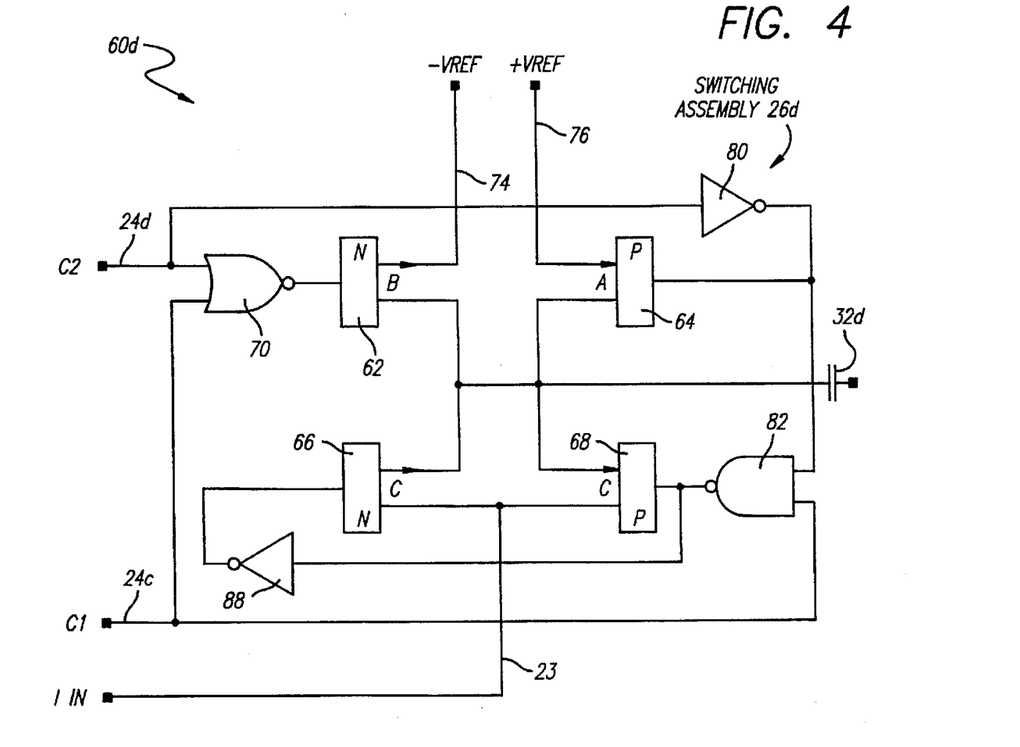
FIG. 4 is a circuit diagram showing in additional detail a transistor version of one of the switching assemblies shown in FIG. 2.

FIG. 4 shows a transistorized switching assembly, generally indicated at 60 for the switching assembly 26d shown in FIG. 2. It will be appreciated that the same type of transistorized switching assembly will be provided for each of the other switching assemblies 26a–26c and 26e–26h shown in FIG. 2. The transistorized switching assembly 60d includes a plurality of transistors, preferably MOS types of transistors. These are indicated at 62, 64, 66 and 68 in FIG. 4. The transistors 62 and 66 are preferably MOS transistors of the n- type and the transistors 64 and 68 are preferably transistors of the p- type.

The transistorized switching assembly 60 is shown as corresponding to the switching stage 26d in FIG. 2. The transistorized switching assembly 60 accordingly has a first input (designated as C 1) on the line 24c and has a second input (designated as C 2) on the line 24d. The transistorized switching assembly 60 also has a third input on the line 23, this input providing the analog voltage representing the binary inputs on the bus 12.

The lines 24c and 24d are connected to the input of a NOR gate 70, the output of which is introduced to the gate of the transistor 62. The source of the transistor 62 receives a −$V_{REF}$ voltage on a line 74. The drain of the transistor 62 is common with the drains of the transistors 64, 66 and 68 and with the capacitor 32d. The source of the transistor 64 receives a +$V_{REF}$ voltage on a line 76.

The input of the inverter 80 has a common connection with the line 24d. The output of the inverter 80 is introduced to the gate of the transistor 64. The output of the inverter 80 also passes to one input of a NAND gate 82 which has another input terminal connected to the line 24c. The output of the NAND gate 82 is introduced to the gate of the transistor 68. The output from the NAND gate 82 also passes to an inverter 88. The output of the inverter 88 is introduced to the gate of the transistor 66. The sources of the transistors 66 and 68 receive the voltage on the line 23 also shown in FIG. 2.

When the voltage on the line 24d is high, the inverter 80 output is low. This causes the voltage on the gate of the transistor 64 to become low so that the transistor becomes conductive. Current accordingly flows through the transistor 64 from the +$V_{REF}$ line 76 to charge the capacitor 32d. The line 24d may provide a low voltage at the same time as the high voltage on the line 24d. This voltage is introduced to the NAND gate 82. This voltage causes the NAND gate 82 to output a high voltage. In this way, the transistor 68 is prevented from being conductive. The transistor 68 might otherwise be conductive because of the high voltage produced on the drain of the transistor 64 as a result of the conductivity of the transistor 64. By preventing the transistor 68 from being conductive, current cannot flow to the capacitor 32d from the interpolation line 23.

Figure 5:
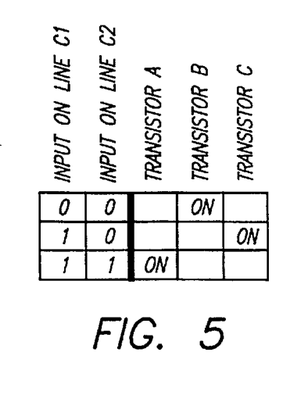
FIG. 5 is a chart showing how each of the switching assemblies shown in FIGS. 3 and 4 responds to patterns of input signals to produce an output dependent upon such pattern.

As will be seen from the previous discussion and as shown in the third row of FIG. 5, the transistor 64 becomes conductive to charge the capacitor 32d with the +$V_{REF}$ voltage when the voltages on the thermometer lines 24c and 24d are simultaneously high. This is indicated by the letter "A" in the third column in FIG. 5 and by the designation of the transistor 64 by the letter A in FIG. 4.

The transistor 62 becomes conductive to charge the capacitor 32d with the −$V_{REF}$ voltage on the line 74 when the voltages on the thermometer lines 24c and 24d are simultaneously low. This is shown in the first row of FIG. 5. It is indicated by the letter "B" in the fourth column of FIG. 5 and by the designation of the transistor 62 by the letter "B" in FIG. 4.

The conductivity of the transistor 62 with simultaneous low voltages on the lines 24c and 24d may be seen from the following discussion. When the voltages on the lines 24c and 24d are simultaneously low, the NOR network 70 produces a high voltage. This voltage causes the transistor 62 to become conductive so that a current flows through the capacitor 32d from the line 74 to charge the capacitor to the $-V_{REF}$ voltage. At the same time, the low voltage on the line 24d is inverted to a high voltage by the inverter 80. The high voltage prevents the transistor 64 from being conductive. The low voltage on the line 24c is introduced to the NAND gate 82 to produce a high voltage at the output of the NAND gate. This high voltage prevents the transistor 68 from conducting. This high voltage is inverted to a low voltage by the amplifier-inverter 88. This low voltage prevents the transistor 66 from conducting. By preventing the transistors 66 and 68 from conducting, the capacitor 32d cannot be charged by the voltage on the interpolation line 23.

A high voltage may sometimes be produced on the line 24c and a low voltage may be simultaneously produced on the logic line 24d when there is a transition at these lines between the high voltage on the lines 24a, 24b and 24c and the logic low voltage on the lines 24d–24g. The high voltage on the line 24c prevents the NAND gate 70 from producing a high voltage to make the transistor 62 conductive. When inverted by the amplifier-inverter 80, the low voltage on the line 24d prevents the transistor 64 from being conductive.

Since the NAND gate 82 simultaneously receives high voltages at its input terminals, it produces a low voltage at its output terminal. This low voltage is introduced to the gate of the transistor 68 to make the transistor conductive. At the same time, the low voltage from the NOR gate 82 is inverted by the amplifier-inverter 88 and is introduced as a high voltage to the transistor 66 to make the transistor conductive. The simultaneous conductivity of the transistors 66 and 68 is indicated in the bottom row of the chart shown in FIG. 5. The transistors 66 and 68 are designated by the letter "C" in the fifth column of FIG. 5 and in FIG. 4.

When the transistors 66 and 68 become conductive, current flows through the transistors from the line 23 to charge the capacitor 32d. The capacitor 32d accordingly becomes charged to a voltage indicative of the analog voltage representing the least significant binary bits. It is desirable that both the transistor 66 (an n- transistor) and the transistor 68 (a p- transistor) be simultaneously conductive to charge the capacitor 32d in accordance with the value of the analog voltage on the line 23. One reason is that the analog voltage on the line 23 can vary through a wide range of values depending upon the analog value of the least significant binary bits.

For high values of the analog voltage on the line 23, the transistor 68 can provide a low resistance because the gate of the transistor is receiving a negative voltage and the voltage on the source of the transistor from the line 23 is high. For low values of the analog voltage in the line 23, the transistor 66 can provide a low resistance because the gate is receiving a high voltage and the voltage on the source from the line 23 is low.

Figure 6:
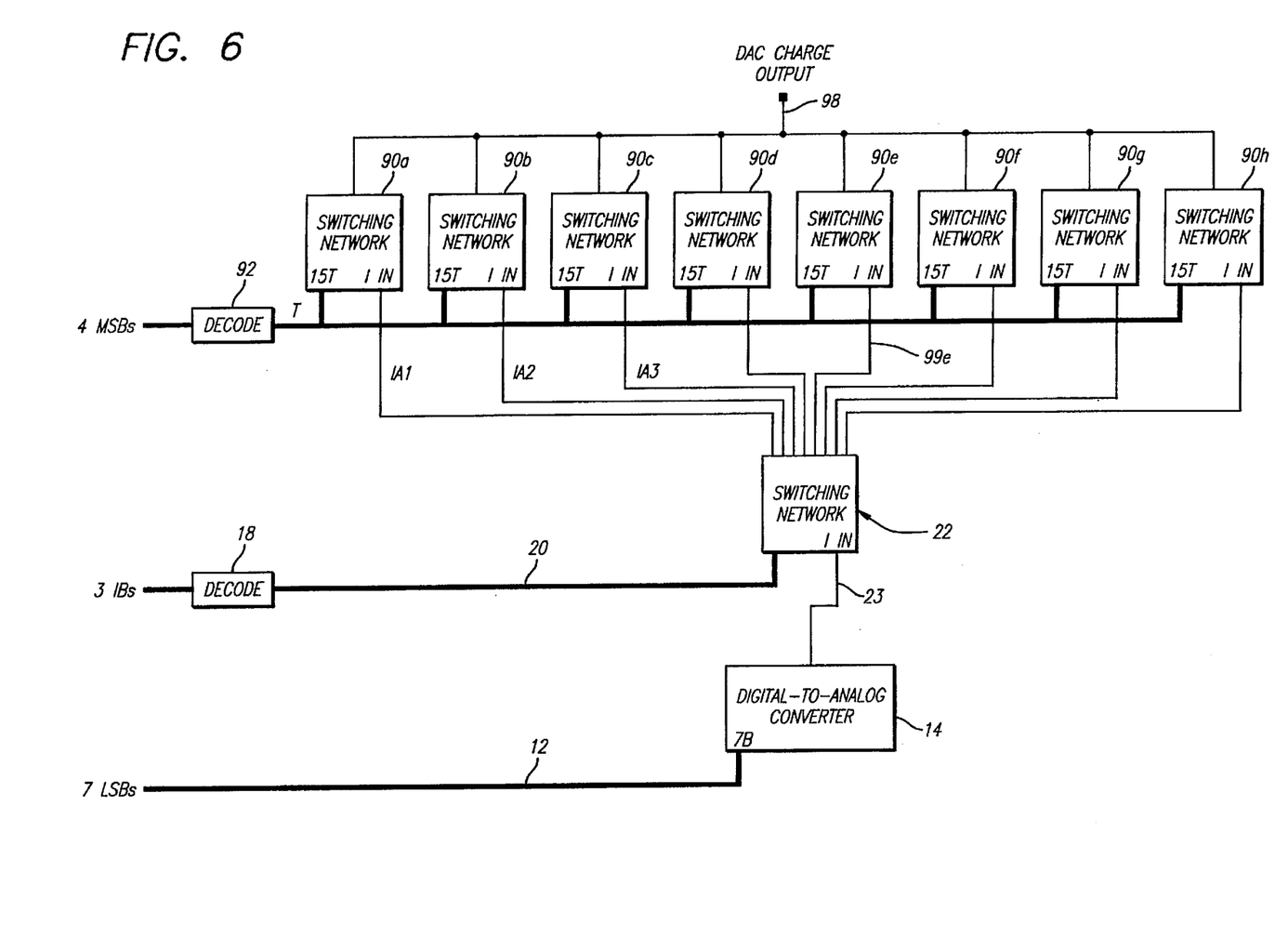
FIG. 6 is a schematic circuit diagram, partly in block form, of a digital-to-analog converter constituting another embodiment of the invention, this embodiment incorporating the switching networks shown in FIG. 1 and also including additional stages for decoding binary bits of greater binary significance than the binary significance of the binary bits converted by the embodiment shown in FIG. 1, FIGS. 7A and 7B are circuit diagrams showing in additional detail one of the additional switching assemblies included in the embodiment shown in FIG. 6.
Figure 7A:
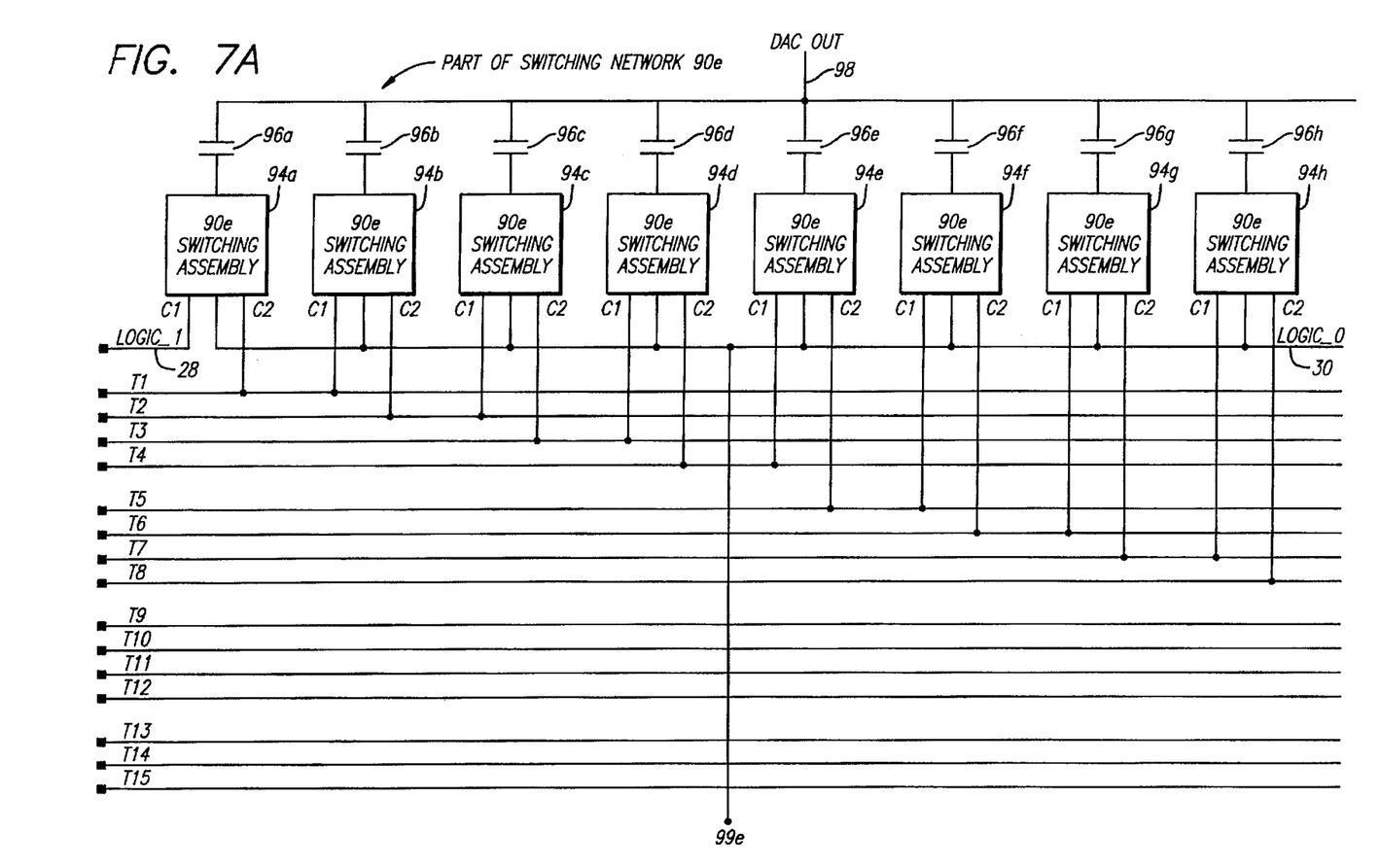
Figure 7B:
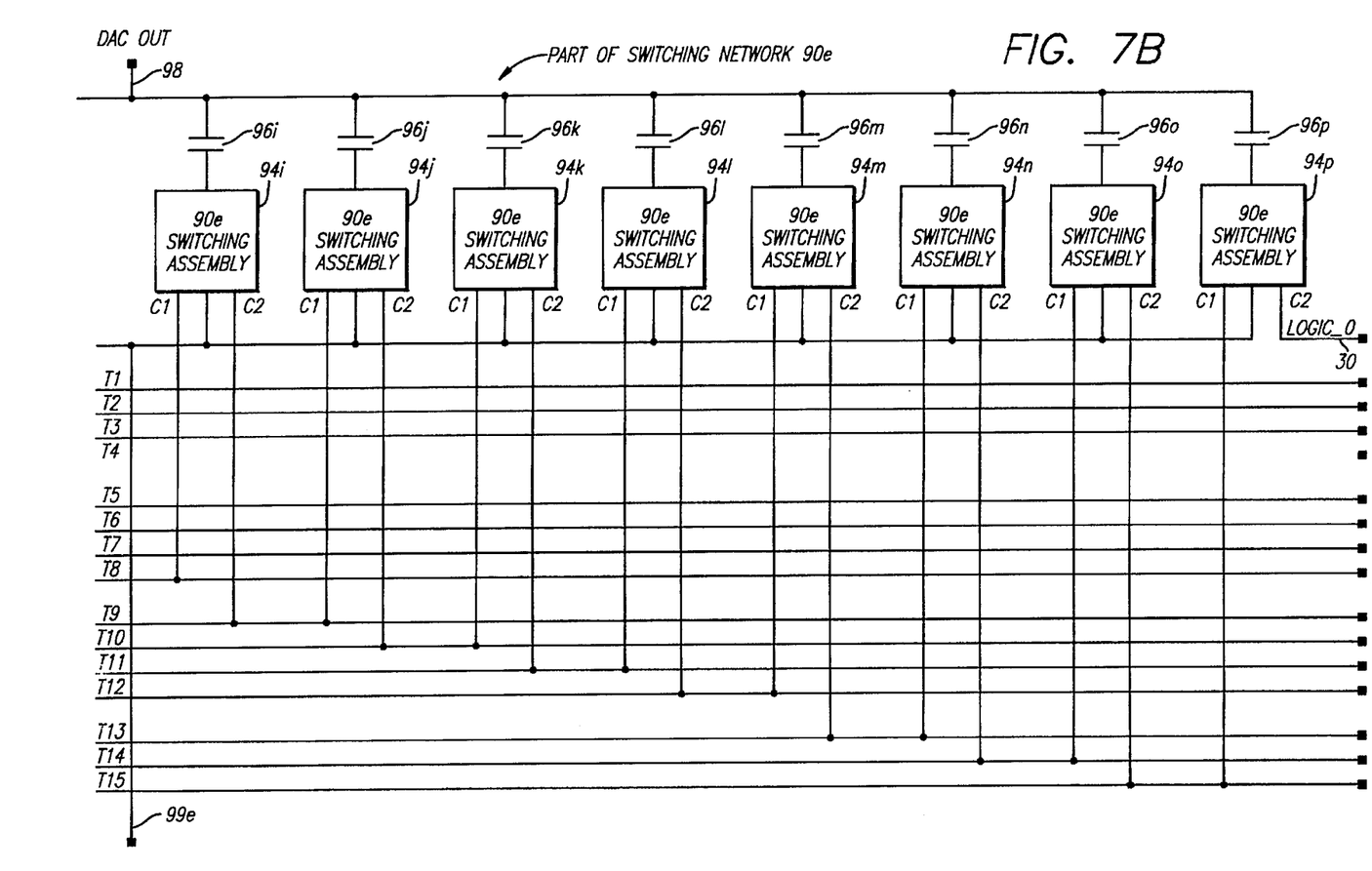

Since the system shown in FIGS. 1–4 and described above is recursive, it can be extended to additional stages on the same recursive basis. This is shown in FIGS. 6, 7A and 7B. As will be seen, the embodiment shown in FIGS. 1–4 illustratively converts ten (10) binary bits to a corresponding analog value. The embodiment shown in FIGS. 6, 7A and 7B illustratively converts fourteen (14) binary bits to a corresponding analog value. It will be appreciated that the system and method of this invention can be extended to provide an analog conversion of any desired number of binary bits in excess of fourteen (14) since the system is recursive.

The embodiment shown in FIGS. 6, 7A and 7B includes the same stages as the embodiment shown in FIG. 1–4. These include the buses 12 and 20, the converter 14, the decoder 18 and the switching network 22, the switching network being formed from the switching networks 26a–26h. However, instead of connecting the inputs to the capacitors 32a–32h to the outputs of the switching networks 26a–h as in the embodiment shown in FIGS. 1–4, the outputs from the switching networks 26a–26h are respectively introduced to the outputs of switching networks 90a–90h.

Each of the switching networks 90a–90h may have a construction as shown in FIGS. 7A and 7B. AS will be seen, the network shown in FIGS. 7A and 7B is similar to the network shown in FIG. 2 in that it provides a thermometer output from a decoder, this decoder being shown at 92 in FIG. 6. However, the decoder 92 receives the binary inputs from the four (4) binary bits of the greatest binary significance. This is in contrast to the three (3) binary bits introduced to the decoder 18.

Since the decoder 92 receives four (4) binary bits, it provides fifteen (15) outputs in a thermometer code. This is shown in the switching network 90e shown in block form in FIG. 6 and in expanded block form in FIGS. 7A and 7B. In FIG. 7, the switching network 90e has a plurality of switching assemblies 94a–94p each corresponding in construction to the switching assembly 26d shown in FIG. 4.

Each of the switching assemblies 94a–94p receives inputs from an individual pair of the successive thermometer outputs from the decoder 92. However, the first one of the switching assemblies 94a–94p receives a logic "1" input and the last one of the switching assemblies receives a logic "0" input. This is similar to what is shown in FIG. 2. Furthermore, each of the switching assemblies 94a–94p receives the output from the switching assemblies 26a–26h in FIG. 2. The output from each of switching assemblies 94a–94p is introduced to an individual one of capacitors 96a–96p to charge such capacitors. The capacitors 96a–96p are connected to a common output line 98.

It will be appreciated that a switching network corresponding to the switching network 90e shown in FIGS. 7A and 7B and including the switching assemblies 94a–94p is provided for each of the switching networks 90a–90h in FIG. 6. Furthermore, each of the switching assemblies for each of the switching networks 90a–90h respectively receives an output from one of the switching assemblies in the switching network 22. The switching network 22 is constructed in a manner identical to the switching network 22 of FIG. 1 with one (1) major exception, the capacitors 32a–32h shown in FIG. 2 being replaced with wires (capacitors being deleted). Furthermore, a separate capacitor corresponding to the one of the capacitors 96a–96h is connected to each of the switching assemblies included in each of the switching networks 90a–90d and 90f–90h. All of these capacitors are connected to the output line 98.

Some of the outputs from the capacitors 96a–96h may constitute $+V_{REF}$ and others may constitute $-V_{REF}$ and one of the outputs constitutes the analog voltage on a line 99e extending from the switching assembly 22 to the switching network 90e. In view of this, when the switching network 94e receives the voltage $V_{REF}$ from a line 99e in the example carrying from the embodiment shown in FIGS. 1–4, it provides the $+V_{REF}$ reference charge on the particular one of the switching networks 94a–94p where one of the thermometer inputs is a positive voltage and the other thermometer input is a negative voltage. Similarly, when the switching network 94e receives a charge corresponding to the $-V_{REF}$ reference from the line 99e in the example carrying from the embodiment shown in FIGS. 1–4, it provides the $-V_{REF}$ reference charge on such particular one of the switching networks 94a–94p. Likewise, when the switching network 94e receives from the line 99e the charge corresponding to the analog voltage on the interpolation line 23, it provides such charge on such particular one of the switching networks 94a–94p.

The invention described above has certain important advantages. It converts the least significant binary bits to an analog voltage in a conventional manner and decodes the most significant bits, or groups of the most significant bits, to provide a plurality of outputs in a thermometer code. The analog output representing the least significant bits is introduced on the interpolation line 23 to the switching network 22 which may be recursive and may be formed from a plurality of switching assemblies having a recursive construction. The outputs from the switching network 22 may also be in a thermometer code. When the decoder 18 decodes the most significant binary bits, the thermometer outputs from the switching network 22 are combined to provide an analog output corresponding to the value of all of the binary coded inputs.

An additional group of binary bits of even greater binary significance may be decoded in the decoder 92 to provide a plurality of outputs in a thermometer code. The switching networks 90a–90h associated with the binary bits of greatest decoder binary significance receive the thermometer outputs from the switching network 22 of intermediate binary significance. Such switching networks 90a–90h of greatest binary significance may also be recursive and may have the same construction as the switching network 22 of intermediate binary significance. The thermometer outputs of the switching networks 90a–90h of greatest binary significance are combined to produce the analog value representative of all of the binary coded inputs.

The invention offers other advantages of some importance. By decoding groups of binary bits to produce the thermometer outputs, the complexity of the converter of this invention is significantly reduced. Furthermore, the construction of switching networks with recursive characteristics also reduces the complexity of the converter. This is particularly significant in reducing the number of distributed capacitances in the converter. It is also important since the number of capacitors such as the capacitors 32a–32h in the embodiment shown in FIG. 2 and the capacitors 96a–96p in the embodiment shown in FIGS. 6, 7A and 7B are minimized in number. In this way, applicant is able to provide a converter which is relatively simple in construction and fast in operation and which has differential and integral linearity. For example, applicant is able to convert a binary input of sixteen (16) binary bits to a corresponding analog value at a frequency of approximately five megahertz (5 Mhz) with an error of less than the (1) least significant binary bit.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing a conversion between a plurality of binary coded inputs and an analog output, each of the binary coded inputs in the plurality having an individual binary significance, first means for decoding a first number of binary coded inputs of reduced binary significance in the plurality of the binary coded inputs and for producing an analog output representative of the value of such binary coded inputs of the reduced binary significance, second means for decoding a number of binary coded inputs of increased binary significance in the plurality of the binary coded inputs to produce a first plurality of outputs in a thermometer code, a plurality of recursive means responsive to the analog output from the first means and responsive to individual ones of the outputs in the first plurality in the thermometer code from the second means for producing a second plurality of outputs in a thermometer code, and means for combining the outputs in the second plurality from the recursive means in the plurality to obtain the analog output representative of the binary coded inputs.

2. In combination for providing a conversion between a plurality of binary coded inputs and an analog output, each of the binary coded inputs in the plurality having an individual binary significance, first means for decoding a first number of binary coded inputs of reduced binary significance in the plurality of the binary coded inputs and for producing an analog output representative of the value of such binary coded inputs of the reduced binary significance, second means for decoding a number of binary coded inputs of increased binary significance in the plurality of the binary coded inputs to produce a first plurality of outputs in a thermometer code, a plurality of recursive means responsive to the analog output from the first means and individual ones of the outputs in the first plurality in the thermometer code from the second means for producing a second plurality of outputs in a thermometer code, means for combining the outputs in the second plurality from the recursive means in the plurality to obtain the analog output representative of the binary coded inputs, means for providing a first reference output, means for providing a second reference voltage, each of the recursive means, except one, being responsive to individual ones of the outputs in the second plurality for passing individual ones of the first and second reference voltages, the one recursive means in the plurality being responsive to the analog output from the first means for passing such analog output, the analog output having a value between the first and second reference voltages, and means for combining the first and second reference voltages from the recursive means in the plurality and the analog output from the one recursive means for obtaining the analog output representative of the binary coded inputs.

3. In combination for providing a conversion between a plurality of binary coded inputs and an analog output, each of the binary coded inputs in the plurality having an individual binary significance, first means for decoding a first number of binary coded inputs of reduced binary significance in the plurality of the binary coded inputs and for producing an analog output representative of the value of such binary coded inputs of the reduced binary significance, second means for decoding a number of binary coded inputs of increased binary significance in the plurality of the binary coded inputs to produce a first plurality of outputs in a thermometer code, a plurality of recursive means each responsive to the analog output from the first means and individual ones of the outputs in the first plurality in the thermometer code from the second means for producing a second plurality of outputs in a thermometer code, means for combining the outputs in the second plurality from the recursive means in the plurality to obtain the analog output representative of the binary coded inputs, means for providing a first reference output, means for providing a second reference output, the recursive means including a plurality of switching means, each operatively coupled to the first and second reference output means and to individual ones of the thermometer outputs in the first plurality for passing one of the first reference voltage, the second reference voltage and the analog output, and means operatively coupled to the switching means in the plurality for producing an analog output dependent upon the pattern of passage of the first reference output, the second reference output and the analog output and representative of the binary coded inputs in the plurality.

4. In a combination as set forth in claim 3, a plurality of capacitors each operatively coupled to an individual one of the switching means in the plurality for producing a current dependent upon the passage of the first reference output, the second reference output or the analog output by such individual one of the switching means.

5. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs and for producing an analog output representative of the value of such binary coded inputs of the least binary significance, second means for decoding a number of binary coded inputs of intermediate binary significance in the plurality of the binary coded inputs to produce a first plurality of outputs in a thermometer code, third means for decoding a number of binary coded inputs of highest binary significance in the plurality of the binary coded inputs to produce a second plurality of outputs in a thermometer code, first recursive means responsive to the analog output from the first means and to the outputs in the thermometer code from the second means for producing in a thermometer code a third plurality of outputs representative of the value of the binary inputs of the least and the intermediate binary significances, a plurality of second recursive means each having the same recursive construction as the first recursive means and each responsive to the outputs in the thermometer code from the third means and to an individual one of the outputs from the first recursive means for producing resultant outputs, and fourth means for producing an analog output constituting an accumulation of the resultant outputs from the second recursive means in the plurality and representing the binary coded inputs.

6. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs and for producing an analog output representative of the value of such binary coded inputs of the least binary significance, second means for decoding a number of binary coded inputs of intermediate binary significance in the plurality of the binary coded inputs to produce a first plurality of outputs in a thermometer code, third means for decoding a number of binary coded inputs of highest binary significance in the plurality of the binary coded inputs to produce a second plurality of outputs in a thermometer code, first recursive means responsive to the analog output from the first means and to the outputs in the thermometer code from the second means for producing in a thermometer code a third plurality of outputs representative of the value of the binary bits of the least and the intermediate binary significances, a plurality of second recursive means each having the same recursive construction as the first recursive means and each responsive to the outputs in the thermometer code from the third means and to an individual one of the outputs from the first recursive means for producing resultant outputs, fourth means for producing an analog output constituting an accumulation of the resultant outputs from the second recursive means in the plurality and representing the binary coded inputs, the first recursive means including a plurality of recursive stages each responsive to an individual pair of the successive thermometer outputs in the first plurality to produce an individual one of the outputs in the third plurality, an individual one of the recursive stages being operative to produce an output corresponding to the analog output from the first means in accordance with the pattern of the successive thermometer outputs in the first plurality.

7. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs and for producing an analog output representative of the value of such binary coded inputs of the reduced binary significance, second means for decoding a number of binary coded inputs of intermediate binary significance in the plurality of the binary coded inputs to produce a first plurality of outputs in a thermometer code, third means for decoding a number of binary coded inputs of highest binary significance in the plurality of the binary coded inputs to produce a second plurality of outputs in a thermometer code, first recursive means responsive to the analog output from the first means and to the outputs in the thermometer code from the second means for producing in a thermometer code a third plurality of outputs representative of the value of the binary bits of the least and the intermediate binary significances, a plurality of second recursive means each having the same recursive construction as the first recursive means and each responsive to the outputs in the thermometer code from the third means and to an individual one of the outputs from the first recursive means for producing resultant outputs, and fourth means for producing an analog output constituting an accumulation of the resultant outputs from the second recursive means in the plurality and representing the binary coded inputs, the first recursive means including a plurality of switching means each having a recursive construction and each responsive to an individual pair of the successive thermometer outputs in the first plurality to produce an individual one of a first output, a second output and the analog output, and each of the recursive means in the second plurality being responsive to the outputs from the first recursive means and an individual one of the first output, the second output and the analog output to produce an individual one of the first output, the second output and the analog output.

8. In a combination as set forth in claim 7, the fourth means being responsive to the individual ones of the first output, the second output and the analog output from the recursive means in the second plurality to obtain the analog output representative of the binary coded input.

9. In a combination as set forth in claim 7, each of the recursive means in the second plurality including a plurality of recursive stages each responsive to an individual pair of the successive thermometer outputs in the third means to produce the individual one of the first, second and analog outputs.

10. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs to provide an analog output representative of the analog value of such binary coded inputs of the reduced binary significance, means for providing a first output, means for providing a second output, second means for decoding a number of binary coded inputs of increased binary significance in the plurality of the binary coded inputs to provide in a thermometer code a plurality of outputs cumulatively representative of the analog value of such binary coded inputs of the increased binary significance, and a plurality of recursive means each responsive to an individual pair of the successive outputs in the thermometer code from the second means and to the analog output from the first means for producing an individual one of the first and second outputs and the analog output from the first means.

11. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs to provide an analog output representative of the analog value of such binary coded inputs of the reduced binary significance, means for providing a first output, means for providing a second output, second means for decoding a number of binary coded inputs of increased binary significance in the plurality of the binary coded inputs to provide in a thermometer code a plurality of outputs cumulatively representative of the analog value of such binary coded inputs of the increased binary significance, a plurality of recursive means each responsive to an individual pair of the successive outputs in the thermometer code from the second means and to the analog output from the first means for producing an individual one of the first and second outputs and the analog output from the first means, and means for combining the outputs from the recursive means in the plurality to obtain the analog output representative of the binary coded inputs.

12. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs to provide an analog output representative of the analog value of such binary coded inputs of the least binary significance, means for providing a first output, means for providing a second output, second means for decoding a number of binary coded inputs of increased binary significance in the plurality of the binary coded inputs to provide in a thermometer code a plurality of outputs cumulatively representative of the analog value of such binary coded inputs of the increased binary significance, and a plurality of recursive means each responsive to an individual pair of the successive outputs in the thermometer code for producing an individual one of the first and second outputs and the analog output from the first means, each of the recursive means including switching means having first, second and third states of operation and responsive to the individual pair of the successive outputs in the thermometer code for producing an individual one of the first, second and third states of operation, means for providing the first output for each of the switching means in the first state of operation of such switching means, means for providing the second output for each of the switching means in the second state of operation of such switching means, and means for providing the analog output from the first means in the third state of operation of the switching means.

13. In a combination as set forth in claim 12, means for combining the outputs from the different switching means in the plurality, in accordance with the first, second and third states of operation of such different switching means, to obtain the analog output representative of the binary coded inputs.

14. In a combination as set forth in claim 12, the output from the first means constituting a variable analog voltage, the second output providing a first reference voltage greater than the range in the variations of the analog output, and means for providing a second reference voltage no greater than the minimum value in the range in variations of the analog output, each of the switching means in the plurality being operative to produce the first reference voltage in the first state of operation, the second reference voltage in the second state of operation and the analog voltage from the first means in the third state of operation.

15. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs to produce an analog output representative of the binary coded inputs of the least binary significance, second means for decoding a number of binary coded inputs of increased binary significance in the plurality of the binary coded inputs to produce a plurality of outputs in a thermometer code, a plurality of recursive means responsive to the outputs in the thermometer code and to the analog output to produce individual ones of first, second and third outputs, and a plurality of energy storage means each responsive to an individual one of the first, second and third outputs from the recursive means in the plurality for providing a storage of energy in accordance with the individual one of the first, second and third outputs.

16. In a combination as set forth in claim 15, means for producing an analog output representative of the cumulative amount of the energy stored in the energy storage means in the plurality and providing the analog value of the binary coded inputs.

17. In a combination as set forth in claim 15, each of the recursive means including a plurality of switching means interconnected in a relationship to pass first, second and third currents respectively representative of the first, second and third outputs, and means responsive to the switching means in the plurality in the recursive means in the plurality for accumulating such currents to provide an output current constituting the analog output representative of the binary coded inputs.

18. In a combination as set forth in claim 15, each of the recursive means in the plurality including a plurality of switching means interconnected in a particular relationship to provide an individual one of the first, second and third outputs in accordance with the pattern of the outputs introduced in the thermometer code to such recursive means.

19. In combination for providing a conversion between a plurality of binary coded inputs and an analog output, each of the binary coded inputs in the plurality having an individual binary significance, first means for decoding a number of binary coded inputs of least binary significance in the plurality of the binary coded inputs to provide an analog voltage representative of the analog value of such binary coded inputs of the least binary significance, second means for decoding a number of binary coded inputs of increased binary significance in the plurality of the binary coded inputs to provide in a thermometer code a plurality of outputs cumulatively representative of the analog value of such binary coded inputs of the increased binary significance, and third means for providing a first reference voltage for first pairs of successive thermometer outputs less than the thermometer value represented by the outputs in the plurality and for providing a second reference voltage for second pairs of successive thermometer outputs greater than such thermometer value and for providing the analog voltage for a pair of successive thermometer outputs one of which is less than such thermometer value and the other of which is greater than such thermometer value.

20. In a combination as set forth in claim 19, the analog voltage provided by the first means having a variable value between the first and second reference voltages in accordance with the analog value represented by the binary coded bits of least binary significance, and the third means including a plurality of switching means each having first, second and third states of operation and each responsive to an individual one of the pairs of the successive thermometer outputs in the plurality for producing an individual one of the first and second reference voltages and the analog voltage in accordance with the relative values of the successive thermometer outputs in the individual pair.

21. In a combination as set forth in claim 20, fourth means responsive to the first reference voltages, the second reference voltages and the analog voltage from the third means for producing the analog output.

22. In a combination as set forth in claim 20, each of the switching means in the plurality including a plurality of transistors and logic means coupled to the transistors for operating upon the individual pair of the successive thermometer outputs introduced to such switching means to produce an individual one of the first reference voltage, the second reference voltage and the analog voltage in accordance with the relative values of the thermometer outputs in the pair.

23. In a combination as set forth in claim 19, fourth means responsive to the first reference voltages, the second reference voltages and the analog voltage from the third means for producing the analog output.

24. In combination for providing a conversion between a plurality of binary coded inputs and an analog output, each of the binary inputs in the plurality having an individual binary significance, first means for converting a number of binary coded inputs of least binary significance in the plurality of the binary coded inputs into an analog output representative of such binary coded inputs of the least binary significance, second means for converting a number of binary coded inputs of increased binary significance in the plurality of the binary coded inputs into a first plurality of thermometer outputs cumulatively representing such binary coded inputs of increased binary significance, and third means responsive to the thermometer outputs in the first plurality from the second means and the analog output from the first means for producing a second plurality of thermometer outputs cumulatively representing the analog value representative of the binary coded inputs in the plurality.

25. In combination for providing a conversion between a plurality of binary coded inputs and an analog output, each of the binary inputs in the plurality having an individual binary significance, first means for converting a number of binary coded inputs of least binary significance in the plurality of the binary coded inputs into an analog output representative of such binary coded inputs of the least binary significance, second means for converting a number of binary coded inputs of increased binary significance in the plurality of the binary coded inputs into a first plurality of thermometer outputs cumulatively representing such binary coded inputs of the increased binary significance, and third means responsive to the thermometer outputs in the first plurality from the second means and the analog output from the first means for producing a second plurality of thermometer outputs cumulatively representing the analog value representative of the binary coded inputs in the plurality, and fourth means for combining the thermometer outputs in the second plurality to provide the analog output representative of the binary coded inputs in the plurality.

26. In a combination as set forth in claim 25, first means for providing a first reference output, second means for providing a second reference output, the analog output from the first means being between the first and second reference outputs, the third means including switching means for passing individual ones of the first and second reference outputs and the analog output from the first means in accordance with the relative values of successive ones of the thermometer outputs in the first plurality.

27. In a combination as set forth in claim 26, sixth means for combining the thermometer outputs in the fourth plurality to produce the analog output representative of the binary coded inputs in the plurality.

28. In combination for providing a conversion between a plurality of binary coded inputs and an analog output, each of the binary inputs in the plurality having an individual binary significance, first means for converting a number of binary coded inputs of least binary significance in the plurality of the binary coded inputs into an analog output representative of such binary coded inputs of the least binary significance, second means for converting a number of binary coded inputs of increased binary significance in the plurality of the binary coded inputs into a first plurality of thermometer outputs cumulatively representing such binary coded inputs of the increased binary significance, and third means responsive to the thermometer outputs in the first plurality from the second means and the analog output from the first means for producing a second plurality of thermometer outputs cumulatively representing the analog value representative of the binary coded inputs in the plurality, and first means for providing a first reference output greater than the range of values of the analog output from the first means, second means for providing a second reference output no greater than any value in the range of values of the analog output from the first means, and third means responsive to the thermometer outputs in the first plurality and the analog output from the first means and the first and second reference outputs for producing the second plurality of thermometer outputs cumulatively indicating the analog value representative of the binary coded inputs in the plurality, each of the thermometer outputs in the second plurality providing an individual one of the first, second and analog outputs in accordance with the relative values of the thermometer outputs in the first plurality.

29. In combination for providing a conversion between a plurality of binary coded inputs and an analog output, each of the analog inputs in the plurality having an individual binary significance, first means for converting a number of binary coded inputs of least binary significance in the plurality of the binary coded inputs into an analog output representative of such binary coded inputs of the least binary significance, second means for converting a number of binary coded inputs of intermediate binary significance in the plurality of the binary coded inputs into a first plurality of thermometer outputs cumulatively representing such binary coded inputs of the intermediate binary significance, third means for converting a number of binary coded inputs of greatest binary significance in the plurality of the binary coded inputs into a second plurality of thermometer outputs cumulatively representing such binary coded inputs of the greatest binary significance, fourth means responsive to the thermometer outputs in the first plurality from the second means and the analog output from the first means for producing a third plurality of thermometer outputs cumulatively indicating the analog value representative of the least significant binary coded inputs and the binary coded inputs of intermediate binary significance, and fifth means responsive to the thermometer outputs in the second plurality from the third means and the thermometer outputs in the third plurality from the fourth means for producing a fourth plurality of thermometer outputs cumulatively indicating the analog value representative of the binary coded inputs in the plurality.

30. In a combination as set forth in claim 28, the fourth means being operative to produce, as thermometer outputs in the third plurality, individual ones of first and second reference outputs and the analog output from the first means in accordance with the pattern of the successive thermometer outputs in the second means, and the fifth means being operative to produce, as thermometer outputs in the fourth plurality, individual ones of the first and second reference outputs and the analog output from the first means in accordance with the pattern of the successive thermometer outputs in the third means.

31. In a combination as set forth in claim 29, means for providing a first reference output, means for providing a second reference output, the analog output from the first means being between the first reference output and the second reference output, the fourth means including a first plurality of switching means, each of such switching means being operative to provide an individual one of the first and second reference outputs and the analog output from the first means in accordance with the pattern of an individual pair of successive thermometer outputs in the first plurality, the fifth means including a second plurality of switching means, each of such switching means in the second plurality being operative to provide an individual one of the first and second reference outputs and the analog output from the first means in accordance with the pattern of an individual pair of the successive thermometer outputs in the third plurality, and means for combining the thermometer outputs in the fourth plurality to obtain the analog output representative of the binary coded inputs in the plurality.

32. In combination for providing a conversion between a plurality of binary coded inputs and an analog output, each of the binary inputs in the plurality having an individual binary significance, first means for providing a first reference value, second means for providing a second reference value, third means for providing a variable value, fourth means for providing a plurality of thermometer outputs each having an individual one of the first reference value, the second reference value and the variable value in accordance with the binary coded inputs in the plurality, and a plurality of fifth means each responsive to a successive pair of the thermometer outputs in the plurality and to the variable value for obtaining the analog output representative of the binary coded inputs in the plurality.

33. In combination for providing a conversion between a plurality of binary coded inputs and an analog output, each of the binary inputs in the plurality having an individual binary significance, first means for providing a first reference value, second means for providing a second reference value, third means for providing a variable value, fourth means for providing a plurality of thermometer outputs each having an individual one of the first reference value, the second reference value and the variable value in accordance with the binary coded inputs in the plurality, and fifth means for combining the thermometer outputs in the plurality to obtain the analog output representative of the binary coded inputs in the plurality, the variable value being between the first and second reference values, the fourth means including a plurality of sixth means each operative to produce an individual one of the thermometer outputs in the plurality.

34. In a combination as set forth in claim 33, each of the sixth means in the plurality having a recursive construction.

35. In a combination as set forth in claim 33, each of the sixth means in the plurality being formed from a plurality of switching means.

36. In a combination as set forth in claim 35, the switching means in each plurality constituting transistors.

37. In a method of providing a conversion between a plurality of binary coded inputs and an analog output, each of the binary inputs in the plurality having an individual binary significance, the steps of:

providing a first reference value, providing a second reference value, providing a variable value, providing a plurality of thermometer outputs having the first reference value in first successive ones of the thermometer outputs in the plurality and having the second reference value in second successive ones of the thermometer outputs in the plurality, and operating upon successive pairs of the thermometer outputs in the plurality and upon the variable value in individual ones of a plurality of successive stages to provide a first output in first ones of the successive stages in the plurality for first successive ones of the pairs of the thermometer outputs in the plurality, a second output in second ones of the successive stages in the plurality for second successive ones of the pairs of the thermometer outputs in the plurality and a third output for the change between the first reference value and the second reference value in a third one of the successive stages in the plurality for an individual one of the pairs of the thermometer outputs in the plurality.

38. In a method of providing a conversion between a plurality of binary coded inputs and an analog output, each of the binary inputs in the plurality having an individual binary significance, the steps of:

providing a first reference value, providing a second reference value, providing a variable value, providing a plurality of thermometer outputs having the first reference value in first successive ones of the thermometer outputs in the plurality and having the second reference value in second successive ones of the thermometer outputs in the plurality, and operating upon the thermometer outputs in the plurality to provide a first output for the first successive ones of the thermometer outputs in the plurality, a second output for the second successive ones of the thermometer outputs in the plurality and a third output for the change between the first reference value and the second reference value for the thermometer outputs in the plurality, wherein pairs of the successive thermometer outputs in the plurality are processed to obtain, for each pair of the successive thermometer outputs in the plurality, the first output upon the occurrence of the first reference value for both of the successive thermometer outputs in the pair, the second output upon the occurrence of the second reference value for both of the successive thermometer outputs in the pair and the variable value upon the occurrence of the first reference value for one of the successive thermometer outputs in the pair and the second reference value for the other of the successive thermometer outputs in the pair.

39. In a method of providing a conversion between a plurality of binary coded inputs and an analog output, each of the binary inputs in the plurality having an individual binary significance, the steps of:

providing a first reference value, providing a second reference value, providing a variable value, providing a plurality of thermometer outputs having the first reference value in first successive ones of the thermometer outputs in the plurality and having the second reference value in second successive ones of the thermometer outputs in the plurality, and operating upon the thermometer outputs in the plurality to provide a first output for the first successive ones of the thermometer outputs in the plurality, a second output for the second successive ones of the thermometer outputs in the plurality and a third output for the change between the first reference value and the second reference value for the thermometer outputs in the plurality, wherein the first outputs, the second outputs and the variable value are combined to obtain a resultant output representative of the value of the binary coded inputs in the plurality.

40. In a method of providing a conversion between a plurality of binary coded inputs and an analog output, each of the binary inputs in the plurality having an individual binary significance, the steps of:

providing a first reference value, providing a second reference value, providing a variable value, providing a plurality of thermometer outputs having the first reference value in first successive ones of the thermometer outputs in the plurality and having the second reference value in second successive ones of the thermometer outputs in the plurality, and operating upon the thermometer outputs in the plurality to provide a first output for the first successive ones of the thermometer outputs in the plurality, a second output for the second successive ones of the thermometer outputs in the plurality and a third output for the change between the first reference value and the second reference value for the thermometer outputs in the plurality, wherein the pairs of the successive thermometer outputs in the plurality are processed on a recursive basis to obtain the first and second outputs and the variable value for such pairs of the successive thermometer outputs in the plurality and wherein the variable value is between the first and second reference outputs and wherein the first outputs, the second outputs and the variable value are combined to obtain a resultant output representative of the value of the binary coded inputs in the plurality.

41. In a method of providing a conversion between a plurality of binary coded inputs and an analog output, each of the binary inputs in the plurality having an individual binary significance, the steps of:

converting a plurality of binary inputs of a least binary significance to an analog output representative of such binary inputs, decoding a plurality of binary inputs of an increased binary significance to produce a first plurality of thermometer outputs representative of such binary inputs, and producing a second plurality of thermometer outputs representing the plurality of binary coded inputs of the least and the increased binary significances in response to the thermometer outputs in the first plurality and the analog output.

42. In a method of providing a conversion between a plurality of binary coded inputs and an analog output, each of the binary inputs in the plurality having an individual binary significance, the steps of:

converting a plurality of binary inputs of least binary significance to an analog output representative of such binary inputs, decoding a plurality of binary inputs of increased binary significance to produce a first plurality of thermometer outputs representative of such binary inputs, and producing a second plurality of thermometer outputs representing the plurality of binary coded inputs of the least and the increased binary significances in accordance with the thermometer outputs in the first plurality and the analog output, wherein the outputs in the second plurality are combined to produce the analog value representative of the binary coded inputs of least and increased binary significance.

43. In a method of providing a conversion between a plurality of binary coded inputs and an analog output, each of the binary inputs in the plurality having an individual binary significance, the steps of:

converting a plurality of binary inputs of least binary significance to an analog output representative of such binary inputs, decoding a plurality of binary inputs of increased binary significance to produce a first plurality of thermometer outputs representative of such binary inputs, and producing a second plurality of thermometer outputs representing the plurality of binary coded inputs of the least and the increased binary significances in accordance with the thermometer outputs in the first plurality and the analog output, providing a first reference output, providing a second reference output, the analog output representative of the binary inputs of the least binary significance being between the first and second reference outputs, and producing the second plurality of thermometer outputs by comparing pairs of successive thermometer outputs in the second plurality to produce the first reference output, the second reference output or the analog output for each such comparison in accordance with the results of each such comparison.

44. In a method as set forth in claim 43 wherein the first reference output constitutes a first reference voltage, the second reference output constitutes a second reference voltage and the analog output constitutes an analog voltage and wherein the first thermometer outputs in the plurality are produced on a recursive basis and the second thermometer outputs in the plurality are produced on a recursive basis.

45. In combination for providing a conversion between a plurality of binary coded inputs and an analog output, each of the binary inputs in the plurality having an individual binary significance, first means for providing a first reference value, second means for providing a second reference value, third means for providing a variable value, fourth means for simultaneously providing a plurality of thermometer outputs each having an individual one of the first reference value, the second reference value and the variable value in accordance with the binary coded inputs in the plurality, and fifth means for simultaneously combining the thermometer outputs in the plurality to obtain the analog output representative of the binary coded inputs in the plurality.

46. In a method of providing a conversion between a plurality of binary coded inputs and an analog output, each of the binary inputs in the plurality having an individual binary significance, the steps of:

providing a first reference value, providing a second reference value, providing a variable value, simultaneously providing a plurality of thermometer outputs having the first reference value in first successive ones of the thermometer outputs in the plurality and having the second reference value in second successive ones of the thermometer outputs in the plurality, and simultaneously operating upon the thermometer outputs in the plurality to provide a first output for the first successive ones of the thermometer outputs in the plurality, a second output for the second successive ones of the thermometer outputs in the plurality and a third output for the change between the first reference value and the second reference value for the thermometer outputs in the plurality.

* * * * *